United States Patent
Möhrle (10) Patent No.: US 9,484,712 B2
(45) Date of Patent: Nov. 1, 2016

(54) COMBINED GAIN-SOA CHIP

(71) Applicant: Fraunhofer-Gesellschaft zur Foerderung der angewandten Forschung e.V., Munich (DE)

(72) Inventor: Martin Möhrle, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/614,633

(22) Filed: Feb. 5, 2015

(65) Prior Publication Data

US 2016/0233645 A1    Aug. 11, 2016

(51) Int. Cl.
*H01S 5/12* (2006.01)
*H01S 5/10* (2006.01)
*H01S 5/125* (2006.01)

(52) U.S. Cl.
CPC ............. *H01S 5/1228* (2013.01); *H01S 5/101* (2013.01); *H01S 5/125* (2013.01)

(58) Field of Classification Search
CPC ........ H01S 5/14; H01S 5/141; H01S 5/1021; H01S 5/1025; H01S 5/1228; H01S 5/125; H01S 5/5027
See application file for complete search history.

(56) References Cited

U.S. PATENT DOCUMENTS 5,799,024 A * 8/1998 Bowers ............... H01S 5/50
372/11
6,320,888 B1 * 11/2001 Tanaka ............... H01S 5/146
372/102
7,565,084 B1 * 7/2009 Wach ............... H04J 14/04
398/183
2004/0042069 A1 * 3/2004 Fisher ............... H01S 5/026
359/344
2008/0304826 A1    12/2008 Sochava
2011/0310918 A1    12/2011 Yoon
2012/0093178 A1    4/2012 Kim et al.

FOREIGN PATENT DOCUMENTS

JP    2005175021 A * 6/2005

OTHER PUBLICATIONS

Nielsen et al. "Integration of Functional SOA n the Gain chip of an External Cavity Wavelength Tunable Laser Using Etched Mirror Technology" IEEE Selected Topics in Quantum Electronics, vol. 13, No. 5, pp. 1104-1111, (2007).*
Kang et al., "10 Gb/s High Power Electro-Absorption Modulated Laser Monolithically Integrated with a semiconductor optical amplifier for Transmission over 80km", Proceedings of the Optical Fiber Communications conference 2003, pp. 751-752 (2003).*
Jopson, R M. et al., "High-Energy Pulses from a Mode-Locked 1.5-M MQW Laser-Amplifier Photonic Integrated Circuit", Proceedings of the Quantum Electronics and Laser Science Conference; Anaheim; May 1992; XP000350261; ISBN: 978-1-55752-239-9;, May 1992, 200-201.

* cited by examiner

*Primary Examiner* — Eric Bolda
(74) *Attorney, Agent, or Firm* — Michael A. Glenn; Perkins Coie LLP (57) ABSTRACT

A combined Gain-SOA (Semiconductor Optical Amplifier) Chip is provided for forming a hybrid laser by a combination with an external reflector, the Gain-SOA Chip comprising a gain section and an SOA section, wherein an optical grating is arranged between the gain section and the SOA section.

22 Claims, 9 Drawing Sheets

COMBINED GAIN-SOA CHIP

BACKGROUND OF THE INVENTION

The present invention is concerned with a combined Gain-SOA (Semiconductor Optical Amplifier) chip for forming a hybrid laser, and a hybrid laser comprising the combined Gain-SOA Chip.

Hybrid integrated tunable lasers with small line widths, which are increasingly used in optical systems, may comprise an optical output power that is too low for many applications. Such lasers consist of a passive tunable reflector for wavelength selection (e.g. made from silicon, polymer or glass) and an active gain chip (usually an InP chip). In order to increase the optical power, either a separate EDFA (Erbium Doped Fiber Amplifier) or a separate SOA (Semiconductor Optical Amplifier) is coupled downstream [1], which amplifier has to be coupled to the tunable laser in a complicated and precise manner in order to realize a lossless optical coupling.

Conventional approaches, as discussed in [2], suggest integrating a semiconductor optical amplifier on the gain chip used in an external cavity laser. A deeply etched gap between the gain and the SOA section acts as an on-chip mirror. Using such a gain/SOA configuration with a deeply etched gap mirror may achieve the aforementioned desired high output power. However, as the gap width strongly influences the optical coupling losses between the gain and SOA section, very narrow gaps are required and the etching process has to be precisely executed, which leads to an increase in manufacturing costs.

Thus, it would be favorable to have a combined Gain-SOA Chip at hand that can be manufactured in an easier and/or more cost-effective way.

SUMMARY

According to an embodiment, a combined Gain-SOA Chip for forming a hybrid laser by a combination with an external reflector may have: a gain section configured to achieve a light gain within a laser cavity formed by a combination with the external reflector, an SOA section configured to amplify light coupled out of the laser cavity, and an optical grating arranged between the gain section and the SOA section so as to form an end of the laser cavity facing the SOA section, and to achieve the coupling of the light out of the laser cavity. Accordingly, only a single chip has to be hybrid integrated in a tunable laser in order to achieve high output powers, which significantly reduces the total manufacturing costs of such a hybrid laser. Furthermore, there is only one optical coupling region for the hybrid integrated laser, while in the case of downstream coupled SOAs, there is a need to optically couple at least twice. This also leads to a reduction in the manufacturing costs of hybrid integrated tunable lasers with high power output. Still further, the optical coupling takes place within the chip, wherein the combined Gain-SOA Chip does not involve optical coupling losses due to free-beam transmission. Arranging the optical grating between the gain section and the SOA section can be achieved in an easy way such that manufacturing costs can be further reduced.

It is imaginable that the SOA section and the gain section are arranged on a common substrate. This facilitates the combination of the SOA section and the gain section, thereby further reducing the manufacturing costs.

The combined Gain-SOA Chip may have an active layer stack extending through the gain section and the SOA section. Thus, both the gain section and the SOA section can be actively operated.

The optical grating can be an active Distributed Feedback (DFB) grating through which the active layer stack extends. The active region of the device can, for instance, be periodically structured as a diffraction grating, which facilitates the manufacturing process and correspondingly reduces manufacturing costs.

It is further imaginable that the DFB grating is at least partly uncovered and open to the surrounding. This can be achieved, for example, by deeply etching a diffraction grating into the combined Gain-SOA Chip wherein deep etching is a cost effective manufacturing process. The obtained direct coupling against air enables high reflectivity values>30% and thus low threshold currents of the hybrid laser.

The optical grating may be a passive Distributed Bragg Reflector (DBR) grating and the active layer stack may be interrupted at the DBR grating. A passive DBR grating may be cheaper but may achieve the same or at least similar results compared to active gratings. Thus, the use of a DBR grating further reduces manufacturing costs.

The DBR grating may be at least partly uncovered and open to the surrounding. The so obtained direct coupling against air enables high reflectivity values>30% and thus low threshold currents of the hybrid laser.

The gain section may have a gain section end face so as to face the passive reflector, said gain section end face forming a gain section facet. Such a facet may alleviate the coupling of the light-beam into the gain section and the coupling of light-beams that are reflected at the grating out of the gain section.

Furthermore, the gain section end face may have a sloped portion. Accordingly, the diffraction of the light-beam can be manipulated in an easy way, thereby further reducing the manufacturing costs.

It is imaginable that the SOA section may have an SOA section end face for outputting the amplified light, said SOA section end face forming an SOA section facet. Such a facet may alleviate the coupling of the amplified light out of the SOA section.

The SOA section end face may have a sloped portion. Thus, the diffraction of the emitted amplified light may be manipulated in an easy way, thereby further reducing the manufacturing costs.

The gain section may comprise at least one of a sloped and a curved waveguide portion arranged at the gain section end face. Alternatively or in addition, the SOA section may comprise at least one of a sloped and a curved waveguide portion arranged at the SOA section end face. Thus, these curved and/or sloped waveguide portions may alleviate the coupling of the amplified light into and out of the gain section and the SOA section, respectively.

The combined Gain-SOA Chip may further have an anti-reflection coating on at least one of the gain section end face and the SOA section end face. Accordingly, the anti-reflection coating may be applied to the gain section end face and/or the SOA section end face. Applying an anti-reflection coating on these respective surfaces of the combined Gain-SOA Chip can easily be achieved in an, for example, intermediate step during the manufacturing process keeping the manufacturing process simple and cost-effective.

Furthermore, a material of the active layer stack extending through the gain section may differ from the material of the active layer stack extending through the SOA section.

Accordingly, a material optimized regarding laser performance can be used for the gain section whereas a material optimized regarding power amplification can be used for the SOA-section leading to an improvement of the hybrid laser performance.

The gain section and the SOA section may have a common electrical contact. Providing a common electrical contact may reduce the amount of material used for forming the contact and thus to the reduction of related material costs, respectively. Furthermore only one electrical contact is needed in module configuration.

The gain section may be operable in a direct light modulating mode. This is an easy way for achieving the transfer of modulated light carrying data, wherein further light modulating devices may be avoided which leads to a further reduction in manufacturing costs.

The gain section may have at least one active or passive taper for mode transformation. Alternatively or in addition, the SOA section may comprise at least one active or passive taper for mode transformation. Providing tapers may render the combined Gain-SOA Chip versatile regarding low loss coupling to the external cavity (gain section) or optical fiber (SOA section) while using easy and cost effective production methods.

It is imaginable that the SOA section may form an Electro-Absorption-Modulator (EAM). That is, the SOA section comprises substantially the same functionality as an EAM. Accordingly, the SOA section may provide a modulating function in addition to the amplifying function. Implementing several functions into one chip may render the chip versatile while reducing its manufacturing costs.

The combined Gain-SOA Chip may have an Electro-Absorption-Modulator arranged downstream of the optical grating. Accordingly, a combined SOA-EAM section or EAM-SOA section may be used.

Furthermore, a hybrid laser is suggested that has a combined Gain-SOA Chip according to the present invention.

BRIEF DESCRIPTION OF THE DRAWINGS

Embodiments of the present invention will be detailed subsequently with reference to the appended drawings, in which.

DETAILED DESCRIPTION OF EMBODIMENTS OF THE INVENTION

Figure 1:
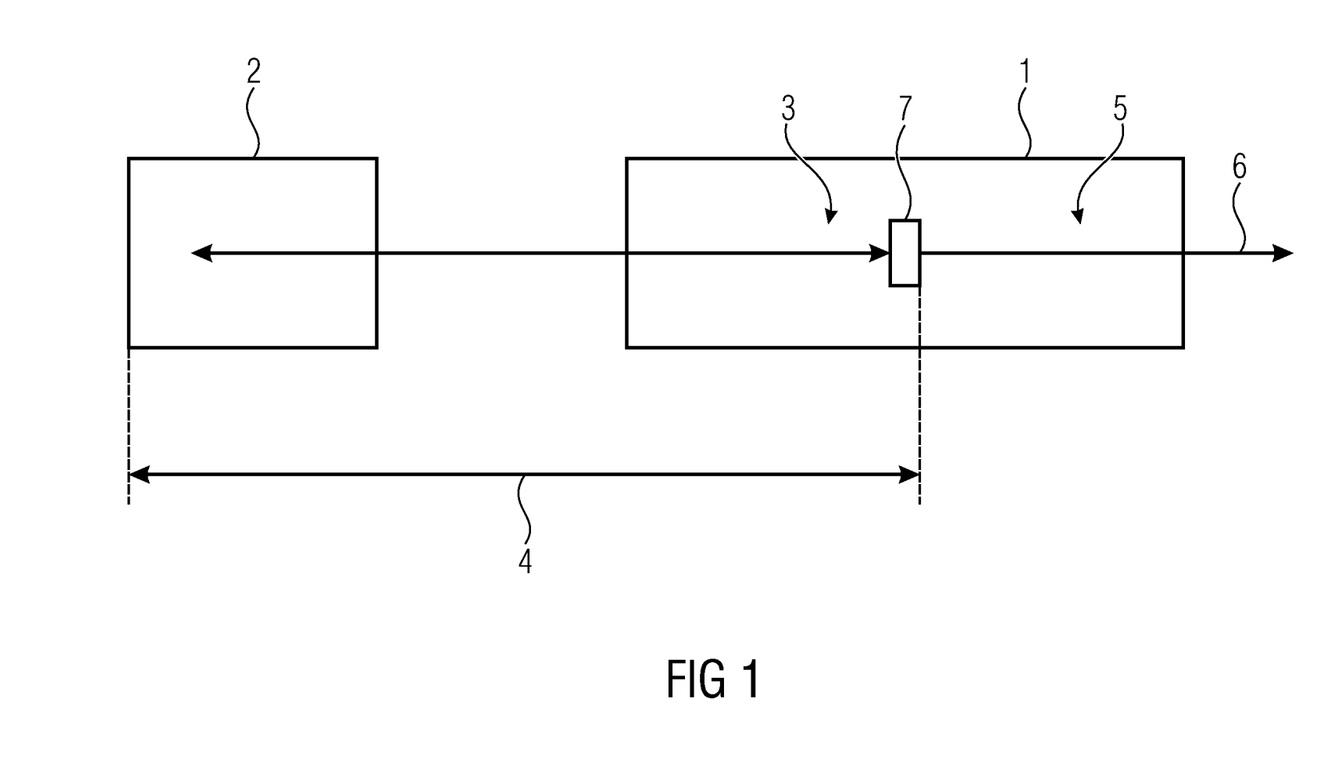
FIG. 1 shows a schematic top view of a combined Gain-SOA Chip comprising an optical grating.

FIG. 1 shows a combined Gain-SOA Chip 1 for forming a hybrid laser by a combination with an external reflector 2. The combined Gain-SOA Chip 1 comprises a gain section 3 and an SOA section 5.

The gain section 3 is configured to achieve a light gain within a laser cavity 4, which laser cavity 4 is formed by a combination with the external reflector 2.

The SOA section 5 is configured to amplify light 6 that is coupled out of the laser cavity 4.

An optical grating 7 is arranged between the gain section 3 and the SOA section 5. The optical grating 7 forms an end of the laser cavity 4 which end faces the SOA section 5. Furthermore, said end of the laser cavity 4 is configured to achieve the coupling of the light 6 out of the laser cavity 4.

Figure 2:
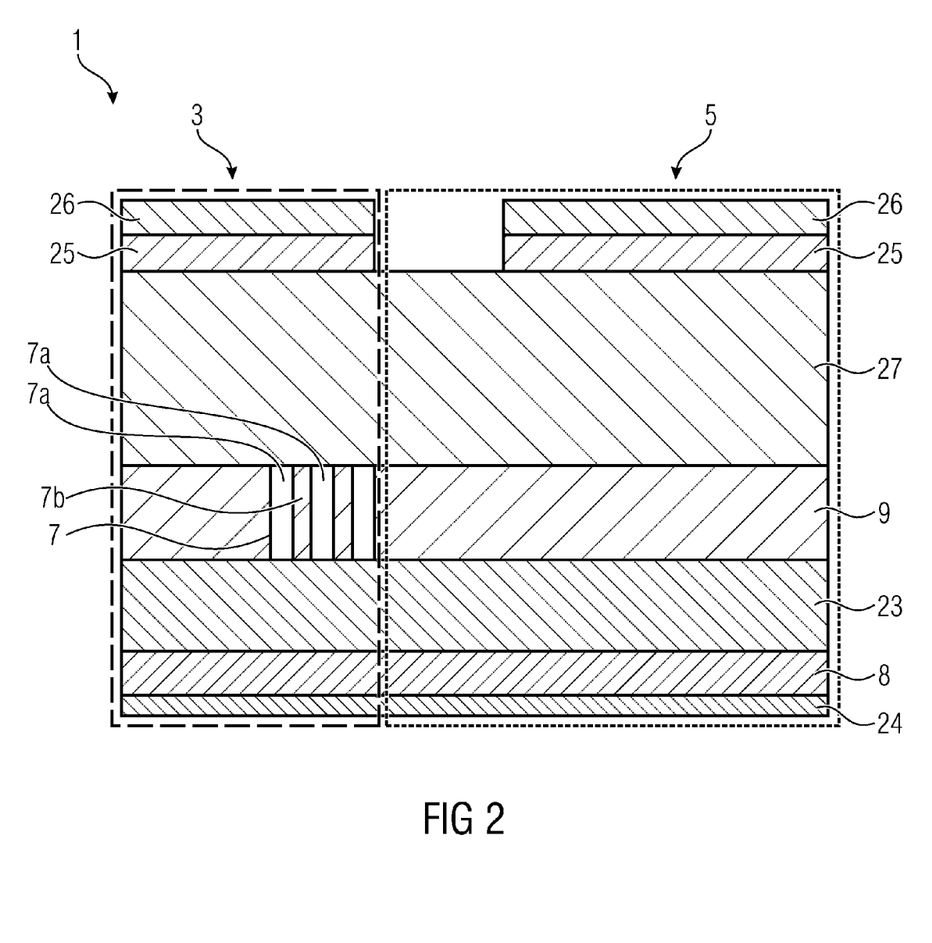
FIG. 2 shows a cross-sectional view of a combined Gain-SOA Chip comprising a DFB grating.

FIG. 2 shows a cross-sectional view of an exemplary combined Gain-SOA Chip 1 according to the present invention. The combined Gain-SOA Chip 1 comprises at least two different regions, wherein the gain section 3 is provided in one of these at least two regions, and the SOA section 5 is provided in the other one of the at least two regions. The region of the combined Gain-SOA Chip 1 in which the gain section 3 is provided is shown in dashed lines. The region of the combined Gain-SOA Chip 1 in which the SOA section 5 is provided is shown in dashed-dotted lines. The dashed and the dashed-dotted lines, respectively, do only schematically represent the regions in which the gain section 3 and the SOA section 5 can be provided in the combined Gain-SOA chip 1. The gain section 3 and the SOA section 5 can, at least partly, overlap at one or more boundaries.

An optical grating 7, which is an active DFB grating in this example, is arranged between the gain section 3 and the SOA section 5, wherein the grating 7 may extend substantially, i.e. to an extent greater than 50%, into the region where the gain section 3 is provided, as shown in FIG. 2, for example, or the grating 7 may extend entirely into the region where the gain section 3 is provided.

Alternatively, the grating 7 may extend substantially, i.e. to an extent greater than 50%, into the region where the SOA section 5 is provided, or the grating 7 may extend entirely into the region where the SOA section 5 is provided. The grating 7 may, however, also be arranged between the gain section 3 and the SOA section 5 in a way that it extends to the same extent into the region where the gain section 3 is provided and into the region where the SOA section 5 is provided. The grating 7 may, however, also be arranged between the gain section 3 and the SOA section 5 without extending in either one of the gain section 3 region and the SOA section 5 region.

Further with respect to FIG. 2, the gain section 3 and the SOA section 5 are arranged on a common substrate 8.

The combined Gain-SOA Chip 1 comprises a first metallization layer stack 26 arranged on an end face of the combined Gain-SOA Chip 1, which is referred to as a 'top side' according to the orientation of the appended drawings.

The combined Gain-SOA Chip 1 further comprises a second metallization layer stack 24 arranged on an end face of the combined Gain-SOA Chip 1 that is opposite the 'top side'. Accordingly, this second end face is referred to as 'bottom side' according to the orientation of the appended drawings.

The combined Gain-SOA Chip 1 comprises an active layer stack 9 extending through the gain section 3. The active layer stack 9 further extends through the SOA section 5.

The active layer stack 9 is arranged above the common substrate 8. An optional intermediate layer stack 23 is arranged between the active layer stack 9 and the common substrate 8. On the bottom side of the common substrate 8, i.e. on the side facing away from the active layer stack 9, the metallization layer stack 24 is attached to the common substrate 8.

On the opposite side, i.e. on the top side of the combined Gain-SOA Chip 1, the metallization layer stack 26 is arranged. Underneath the metallization layer stack 26, i.e. on the side of the metallization layer stack 26 facing the active layer stack 9, a contact layer stack 25 is arranged. Underneath the contact layer stack 25, in other words between the contact layer stack 25 and the active layer stack 9, a further optional intermediate layer stack 27 is arranged.

In the example described with reference to FIG. 2, the bottom metallization layer stack 24 is an n-doped metallization layer stack and the top metallization layer stack 26 is a p-doped metallization layer stack.

The common substrate 8 is an n-doped substrate, in this example an n-doped Indium Phosphide (InP) substrate.

The intermediate layer stack 23 arranged between the common substrate 8 and the active layer stack 9 is an n-doped intermediate layer stack, in this example an n-doped Indium Phosphide (InP) intermediate layer stack.

The active layer stack 9 is comprised of a waveguide and a Multiple Quantum Wells (MQW).

The contact layer stack 25 arranged underneath the top metallization layer stack 26 is a p-doped contact layer stack.

The intermediate layer stack 27 arranged between the contact layer stack 25 and the active layer stack 9 is a p-doped intermediate layer stack, in this example a p-doped Indium Phosphide (InP) intermediate layer stack.

The p-doped and n-doped regions can be interchanged, and the Multiple Quantum Wells (MQW) can be substituted by a Single Quantum Wells (SQW) or a bulk layer which is still within the scope of the present invention.

Still with reference to FIG. 2, the grating 7 is arranged in the active layer stack 9. Accordingly, the optical grating 7 is an active Distributed Feedback (DFB) grating. The active layer stack 9 comprises grooves 7a imparted into the active layer stack 9, for example by etching. Between these grooves 7a, some material of the active layer stack 9 remains. Said remaining material of the active layer stack 9 may comprise the shape of stems or ribs 7b extending between the grooves 7a. In other words, the active layer stack 9 extends through the active DFB grating 7.

Figure 3:
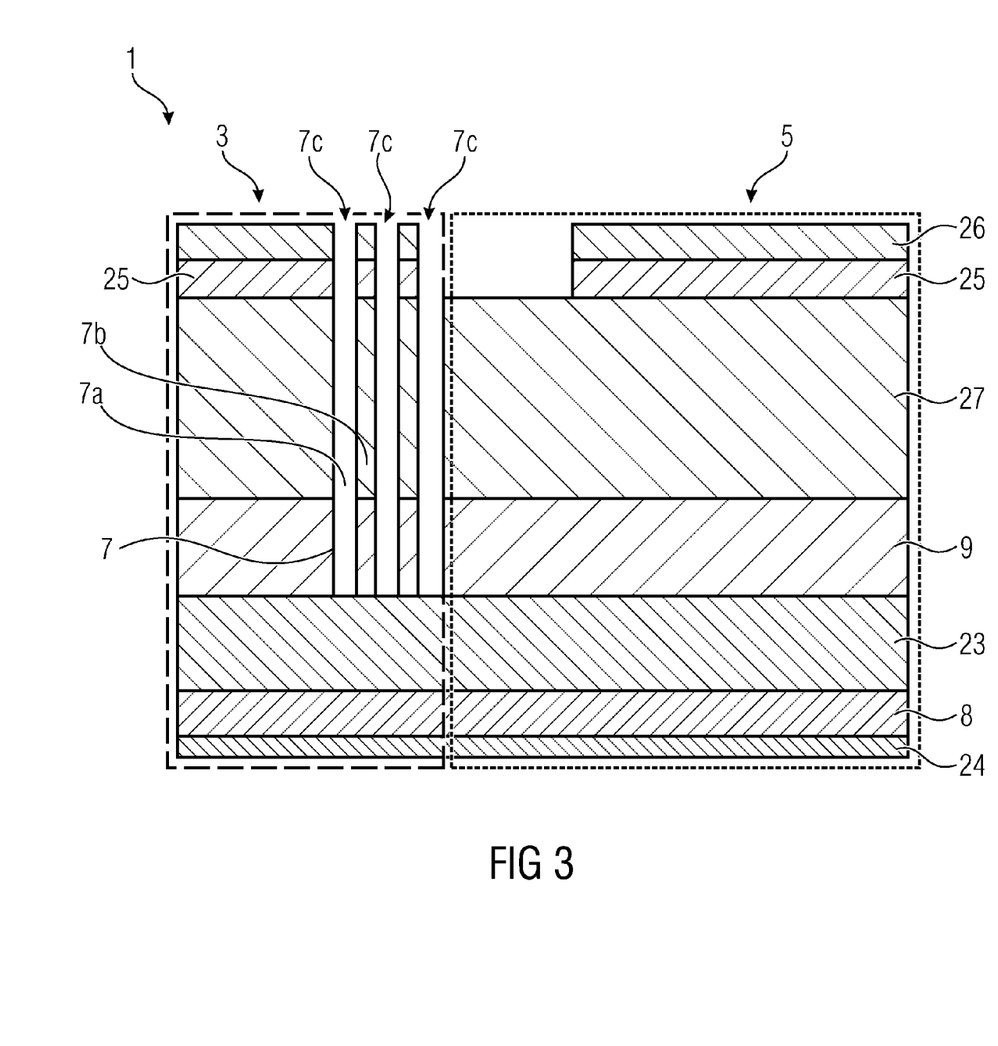
FIG. 3 shows a cross-sectional view of a combined Gain-SOA Chip comprising a DFB grating that is open to the surrounding.

FIG. 3 shows a DFB grating 7 that is at least partly uncovered and open to the surrounding. In other words, the grooves 7a are deeply imparted, for example by etching, into the combined Gain-SOA Chip 1, wherein said grooves 7a extend through the top metallization layer stack 26, the contact layer stack 25, the intermediate layer stack 27 and the active layer stack 9. The material of the respective layer stacks 26, 25, 27, 9 extends between these gaps 7a, forming respective above described ribs 7b of each layer stack.

Optionally, the grating 7 can be realised without metallisation 26.

The grating 7, or the grooves 7a of the grating 7 respectively, comprise(s) at least one opening 7c on the top side of the combined Gain-SOA Chip 1. Accordingly, the grating 7 is at least partly, i.e. at least in those regions where openings 7c are available, uncovered and open to the surrounding.

Figure 4:
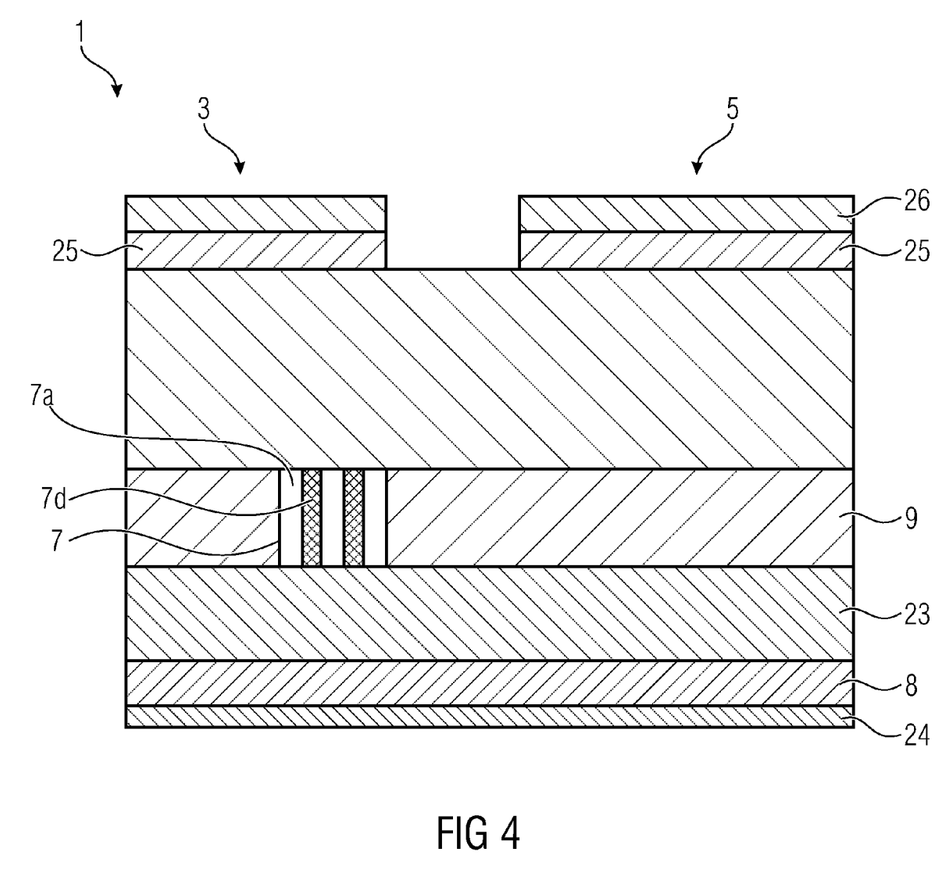
FIG. 4 shows a cross-sectional view of a combined Gain-SOA Chip comprising a DBR grating.

FIG. 4 shows an example in which a passive Distributed Bragg Reflector (DBR) grating 7 is provided. Similar to above described FIG. 3, grooves 7a are imparted, for instance by etching, into layer stack 9. Between those grooves 7a, ribs 7d extend. Compared to the active grating 7 described in FIG. 3, the ribs 7d shown in FIG. 4 comprise a material that is, however, not active. Accordingly, the optical grating 7 shown in FIG. 4 is a passive optical grating. The passive material can be an isolator in general or any other suitable material. The passive DBR grating 7 may also be provided between the gain section 3 and the SOA section 5, or within the SOA section 5 adjacent to the electrical separation area.

The optical grating 7, which is a passive DBR grating in this example, is arranged between the gain section 3 and the SOA section 5, wherein the grating 7 may extend substantially, i.e. to an extent greater than 50%, into the region where the gain section 3 is provided, as shown in FIG. 4, for example, or the grating 7 may extend entirely into the region where the gain section 3 is provided.

Alternatively, the grating 7 may extend substantially, i.e. to an extent greater than 50%, into the region where the SOA section 5 is provided, or the grating 7 may extend entirely into the region where the SOA section 5 is provided. The grating 7 may, however, also be arranged between the gain section 3 and the SOA section 5 in a way that it extends to the same extent into the region where the gain section 3 is provided and into the region where the SOA section 5 is provided. The grating 7 may, however, also be arranged between the gain section 3 and the SOA section 5 without extending in either one of the gain section 3 region and the SOA section 5 region.

Figure 5:
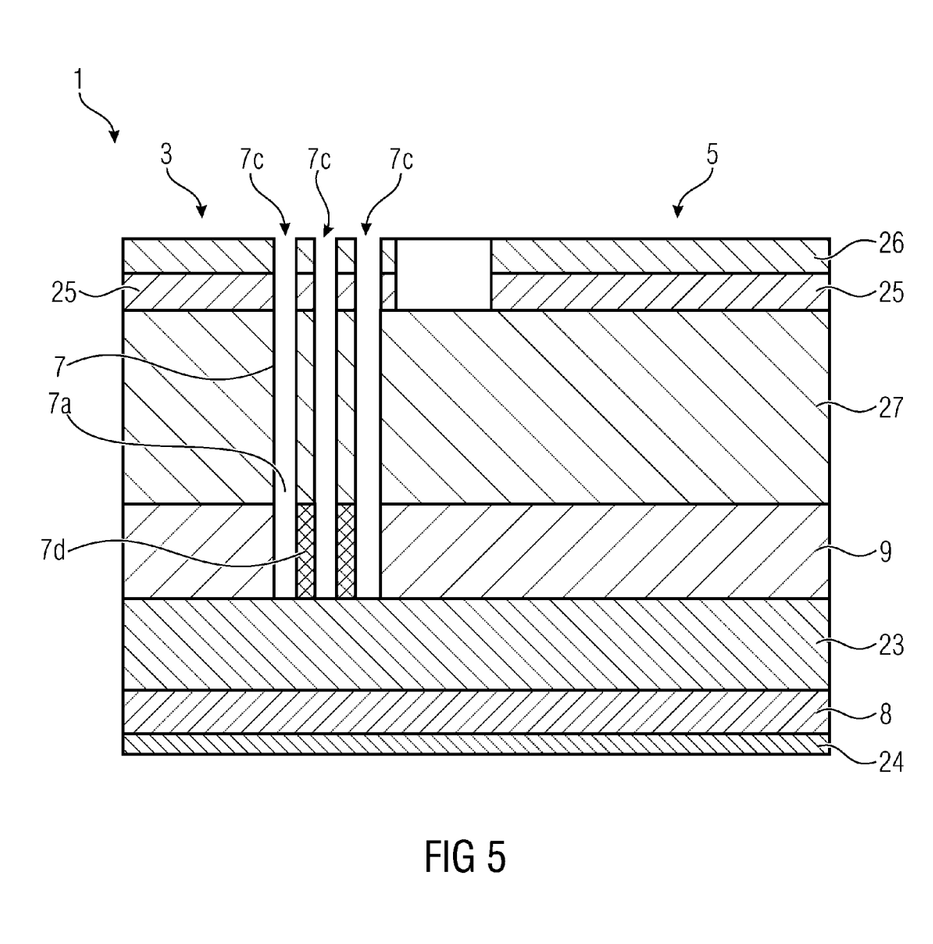
FIG. 5 shows a cross-sectional view of a combined Gain-SOA Chip comprising a DBR grating that is open to the surrounding.

FIG. 5 shows an example of a combined Gain-SOA Chip 1 in which the passive DBR grating 7 is at least partly uncovered and open to the surrounding. In other words, the grooves 7a are deeply imparted, for example by etching, into the combined Gain-SOA Chip 1, wherein said grooves 7a extend through the top metallization layer stack 26, the contact layer stack 25, the intermediate layer stack 27 and the active layer stack 9. Between the gaps 7a, ribs 7d extend which comprise a material that is, however, not active but passive.

Optionally, the grating 7 can be realised without metallisation 26.

Optionally, the gratings as shown in FIGS. 2 to 5 may also extend into at least one of layer 23 and 27.

Such deeply imparted open DBR gratings 7 have the advantage that, due to the coupling against air, reflections of 30% and more can be adjusted.

Furthermore, the usage of a grating 7 that is arranged between the gain section 3 and the SOA section 5, in accordance with the present invention, has several advantages over conventional systems. As the light is directly coupled from the gain section 3 into the grating 7 and into the SOA section 5, there is only one optical coupling point, while conventional systems, such as described in [2], may need to provide at least two coupling points. Furthermore, a light beam that is freely transmitted, for instance through a gap mirror as described in [2], is subject to coupling losses. The present invention instead does not comprise such lossy free-beam transmission.

Figure 6:
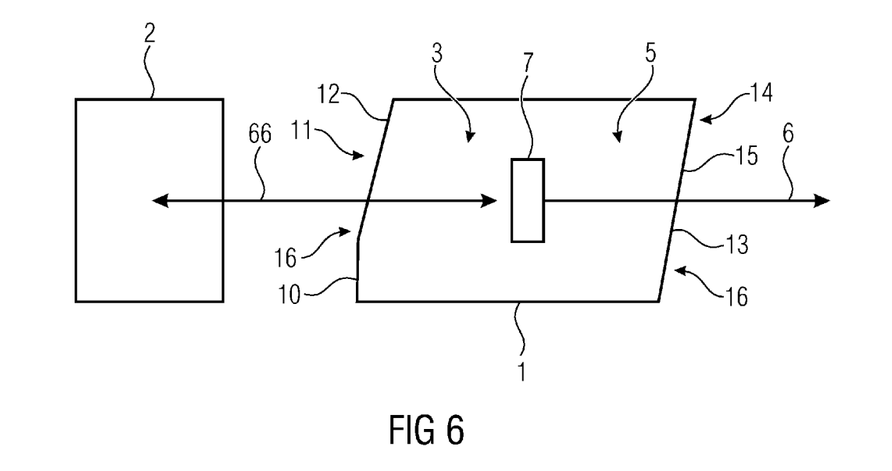
FIG. 6 shows a schematic top view of a combined Gain-SOA Chip comprising at least partly sloped facets.

FIG. 6 shows a schematic top view of a combined Gain-SOA Chip 1 and an external reflector 2. The combined Gain-SOA Chip 1 comprises a grating 7 arranged between the gain section 3 and the SOA section 5.

The gain section 3 comprises a gain section end face 10 that faces the passive reflector 2. Furthermore, said gain section end face 10 forms a gain section facet 11 through which light 66 can be coupled in or coupled out of the combined Gain-SOA Chip 1, more precisely in or out of the gain section 3.

The SOA section 5 comprises an SOA section end face 13 for outputting the amplified light 6 that has been amplified in the SOA section 5. The SOA section end face 13 forms an SOA section facet 14 through which the amplified light 6 can be coupled out of the combined Gain-SOA Chip 1, more precisely out of the SOA section 5.

The gain section end face 10 comprises a sloped portion 12. The SOA section end face 13 comprises a sloped portion 15.

As can be seen in FIG. 6, the sloped portion 15 on the SOA section end face 13 extends over the entire length of the SOA section facet 14 while the sloped portion 12 of the gain section end face 10 only extends partly along the gain section end face 10. Both sloped portions 12, 15 can either extend partly or entirely along the respective end faces 10, 13.

Optionally, the optical waveguide can have a tilted and/or a curved portion on at least one of the gain section end face 10 and the SOA section end face 13. In this case, the respective one of the gain section end face 10 and the SOA section end face 13 may be non-sloped, i.e. may comprise a straight region without a substantially sloped portion.

Still with respect to FIG. 6, the combined Gain-SOA Chip 1 comprises an anti-reflection coating 16 that may be applied to at least one of the gain section facet 11 and the SOA section facet 14. Accordingly, an anti-reflection coating may be applied to both the gain section facet 11 and the SOA section facet 14, or only to one of the gain section facet 11 and the SOA section facet 14.

Figure 7:
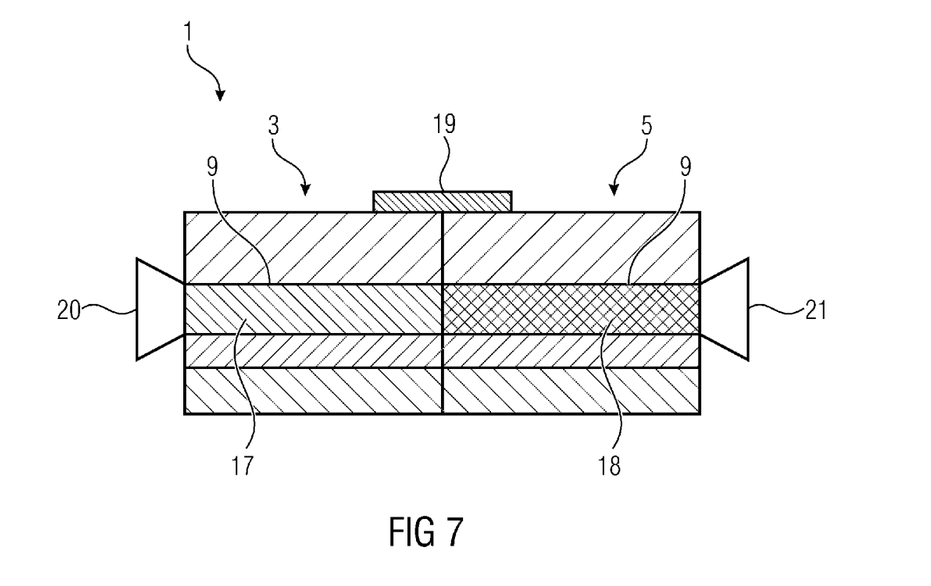
FIG. 7 shows a cross-sectional view of a combined Gain-SOA Chip comprising tapers.

FIG. 7 shows a schematic cross-sectional view of a combined Gain-SOA Chip 1 comprising a gain section 3 and an SOA section 5.

The Gain-SOA Chip 1 further comprises an active layer stack 9 extending through the gain section 3 and through the SOA section 5. However, the material 17 of the active layer stack 9 extending through the gain section 3 differs from the material 18 of the active layer stack 9 extending through the SOA section 5. These different materials are indicated by the cross-hatching 18 in the SOA section 5 compared to the standard line hatching 17 in gain section 3.

The gain section 3 and the SOA section 5 may comprise a common electrical contact 19, as exemplarily shown in FIG. 7. That is, an electrical contact point, for example provided by a soldered conductor 19, is conductively connected with the gain section 3 and the SOA section 5. In conventional systems, two separate contacts are used, one for the gain section and another one for the SOA section.

Furthermore, the gain section 3 comprises a taper 20 for mode transformation. Taper 20 can either be active or passive. The taper 20 is at least connected with the active material layer stack 9 of the gain section 3, but can also be integrated within the gain section 3.

On the opposite side, the SOA section 5 comprises a taper 21 for mode transformation, which can either be active or passive. The taper 21 is at least connected with the active layer stack 9 of the SOA section 5, but can also be integrated within the SOA section 5.

The tapers 20, 21 can also be provided in a way as mentioned above if the gain section 3 and the SOA section 5 comprise a common active layer stack 9 or an active layer stack 9 made of the same material, respectively.

Figure 8:
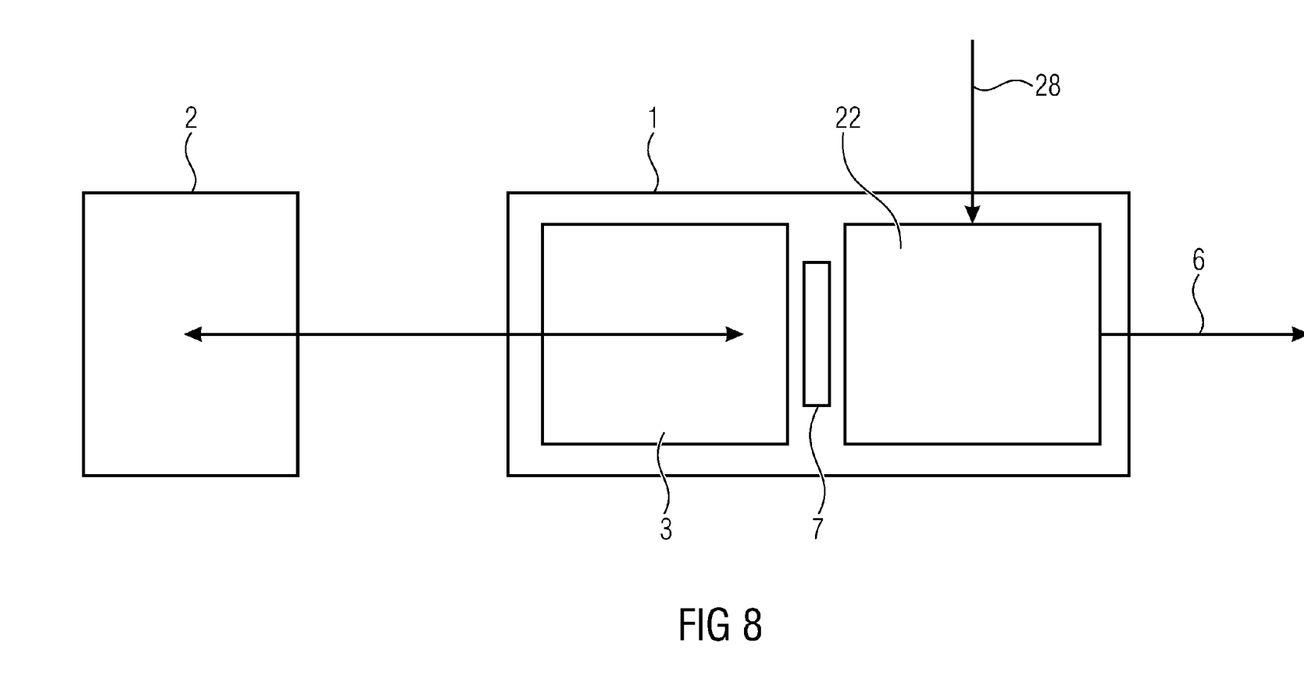
FIG. 8 shows a block diagram of a combined Gain-SOA Chip, wherein the SOA section forms a modulator.

With respect to FIG. 8, a block diagram of a combined Gain-SOA Chip 1 is shown. The combined Gain-SOA Chip 1 comprises a gain section 3 and an SOA section. In this example, the SOA section forms an Electro-Absorption Modulator (EAM) 22.

Figure 9:
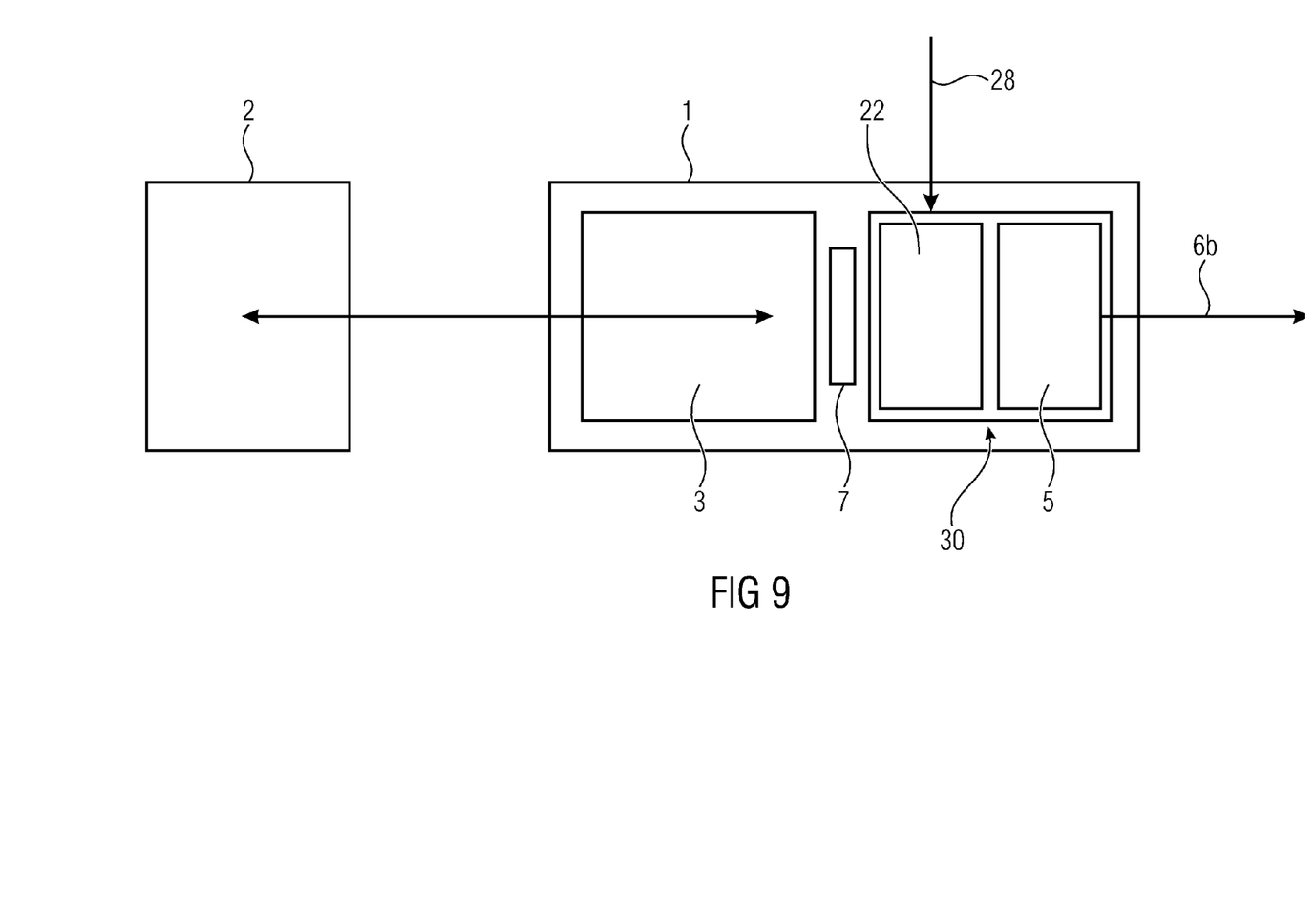
FIG. 9 shows a block diagram of a combined Gain-SOA Chip comprising a modulator arranged downstream of the optical grating.

FIG. 9 shows a further example of a combined Gain-SOA Chip 1 comprising an Electro-Absorption Modulator 22 that is arranged between the gain section 3 and the SOA section 5. The combined EAM-SOA-section 30 provides modulation capability and amplifying function. External data 28 fed into the EAM-SOA-section 30 is modulated and subsequently amplified such that the emitted light-beam 6 comprises modulated data.

Figure 10:
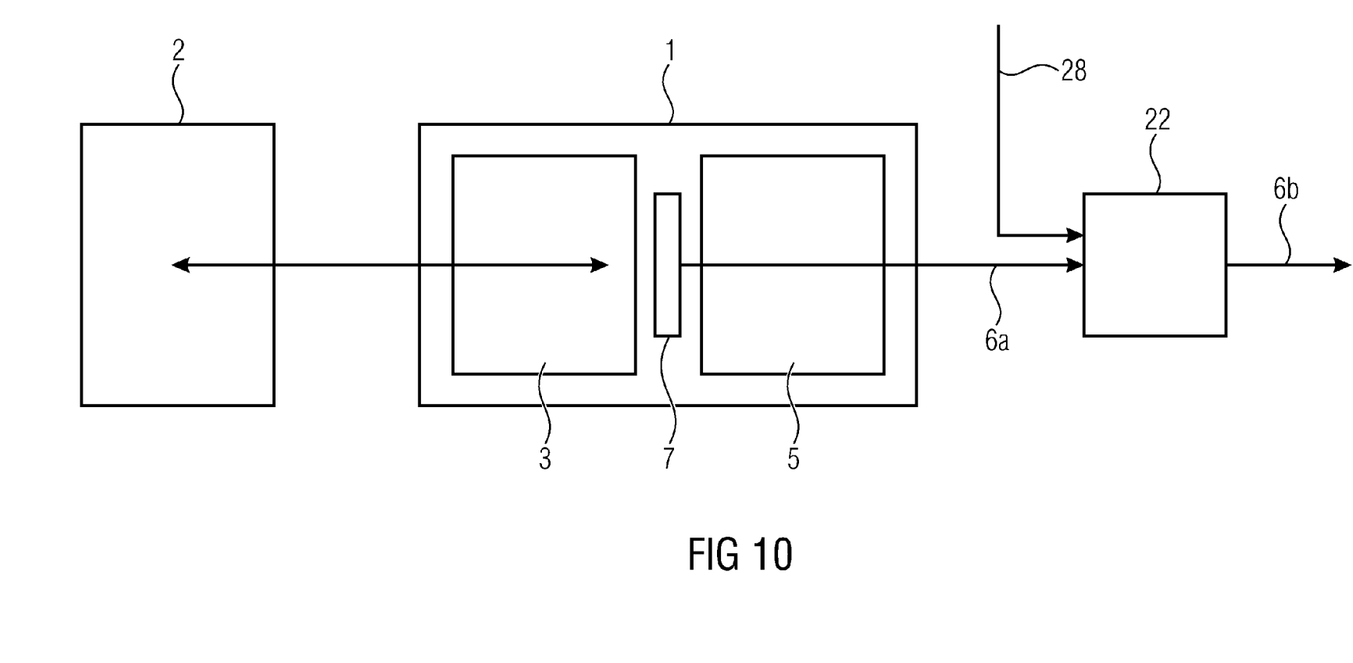
FIG. 10 shows a block diagram of a combined Gain-SOA Chip with an external modulator.

The Electro-Absorption-Modulator 22 can also be arranged downstream of the optical grating 7 and be external from the combined Gain-SOA Chip 1, as shown in FIG. 10. The gained light beam 6a that is coupled out of the combined Gain-SOA Chip 1 is coupled into the Electro-Absorption-Modulator 22 which modulates external data 23 in the same way as described above. Accordingly, the light beam 6b that is coupled out of the Electro-Absorption-Modulator 22 contains the modulated external data 23.

The present invention can be used, for instance, for hybrid integrated tunable lasers or for optical message and data transmission.

The main concept is the monolithic integration of a gain chip comprising a DFB/DBR grating and an SOA-Chip into a combined Gain-SOA-Chip for achieving high optical output power for hybrid integrated tunable lasers.

The laser resonator comprises a passive part, called 'external cavity' or 'laser cavity' for the purpose of this document, which cavity can comprise, e.g. an external mirror or passive Bragg-Grating-Arrangements, as well as the gain section of the SOA-Chip. The gain chip is carried out such that a DFB/DBR-grating (reflection>0) will be realized at the gain side.

Thus, a laser resonator is provided between the tunable external mirror and the gain section (tunable laser assembly). The emitted light is directly coupled into the SOA where it is amplified such that light with high output power is emitted at the output side.

Etching a short complexly coupled DFB grating will result in a reflection spectrum of high spectral bandwidth at the gain side. The magnitude of the reflection is adjustable by the coupling strength, while the spectral width is adjustable by the length of the grating. In this case, the grating acts as a second facet.

The advantage over conventional systems, such as the integrated Gain-SOA-Chip of [2], is that the combined Gain-SOA-Chip of the present invention does not comprise (lossy) free-beam transmission between the gain section and the SOA section, or in other words, the present invention allows for avoiding lossy free-space transmission in the etched gap as in [2].

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as forming within the two-spirited scope of the present invention.

REFERENCES

[1] K. Sato, N. Kobayashi, M. Namiwaka, K. Yamamoto, T. Kita, H. Yamada, H. Yamazaki, "High Output Power and Narrow Linewidth Silicon Photonic Hybrid Ring-filter External Cavity Wavelength Tunable Lasers", ECOC 2014, Cannes, France, paper PD. 2.3

[2] M. Nielsen, S. Sudo, K. Mizutani, T. Okamoto, K. Tsuruoka, K. Sato, and K. Kudo, "Integration of Functional SOA on the Gain Chip of an External Cavity Wavelength Tunable Laser Using Etched Mirror Technology", IEEE Selected Topics in QE, vol. 13, no. 5, pp 1104 . . . 1111, 2007

The invention claimed is:

1. A combined Gain-SOA (Semiconductor Optical Amplifier) Chip for forming a hybrid laser by a combination with an external reflector, the combined Gain-SOA Chip comprising:
 a gain section configured to achieve a light gain within a laser cavity formed by the combination with the external reflector,
 an SOA section configured to amplify light coupled out of the laser cavity, and
 an optical grating arranged between the gain section and the SOA section so as to form an end of the laser cavity facing the SOA section and to achieve the coupling of the light out of the laser cavity.

2. The combined Gain-SOA Chip according to claim 1, wherein the SOA section and the gain section are arranged on a common substrate.

3. The combined Gain-SOA Chip according to claim 1, wherein the Gain-SOA Chip comprises an active layer stack extending through the gain section and the SOA section.

4. The combined Gain-SOA Chip according to claim 3, wherein the optical grating is an active Distributed Feedback (DFB) grating through which the active layer stack extends.

5. The combined Gain-SOA Chip according to claim 4, wherein the DFB grating is at least partly uncovered and open to the surrounding.

6. The combined Gain-SOA Chip according to claim 3, wherein the optical grating is a passive Distributed Bragg Reflector (DBR) grating and the active layer stack is interrupted at the DBR grating.

7. The combined Gain-SOA Chip according to claim 6, wherein the DBR grating is at least partly uncovered and open to the surrounding.

8. The combined Gain-SOA Chip according to claim 1, wherein the gain section comprises a gain section end face so as to face the external reflector, said gain section end face forming a gain section facet.

9. The combined Gain-SOA Chip according to claim 8, wherein the gain section end face comprises a sloped portion.

10. The combined Gain-SOA Chip according to claim 1, wherein the SOA section comprises an SOA section end face for outputting the amplified light, said SOA section end face forming an SOA section facet.

11. The combined Gain-SOA Chip according to claim 10, wherein the SOA section end face comprises a sloped portion.

12. The combined Gain-SOA Chip according to claim 8, wherein the gain section comprises at least one of a sloped and a curved waveguide portion arranged at the gain section end face.

13. The combined Gain-SOA Chip according to claim 10, wherein the SOA section comprises at least one of a sloped and a curved waveguide portion arranged at the SOA section end face.

14. The combined Gain-SOA Chip according to claim 1, further comprising an anti-reflection coating on at least one of the gain section end face and the SOA section end face.

15. The combined Gain-SOA Chip according to claim 3, wherein a material of the active layer stack extending through the gain section differs from the material of the active layer stack extending through the SOA section.

16. The combined Gain-SOA Chip according to claim 1, wherein the gain section and the SOA section comprise a common electrical contact.

17. The combined Gain-SOA Chip according to claim 1, wherein the gain section is operable in a direct light modulating mode.

18. The combined Gain-SOA Chip according to claim 1, wherein the gain section comprises at least one active or passive taper for mode transformation.

19. The combined Gain-SOA Chip according to claim 1, wherein the SOA section comprises at least one active or passive taper for mode transformation.

20. The combined Gain-SOA Chip according to claim 1, wherein the SOA section forms an Electro-Absorption-Modulator.

21. The combined Gain-SOA Chip according to claim 17, further comprising an Electro-Absorption-Modulator arranged downstream of the optical grating.

22. Hybrid laser comprising a combined Gain-SOA Chip according to claim 1.

* * * * *